United States Patent [19]

Herden et al.

[11] Patent Number: 5,002,034

[45] Date of Patent: Mar. 26, 1991

[54] HIGH-VOLTAGE SWITCH

[75] Inventors: Werner Herden, Gerlingen; Walter Benedikt, Kornwestheim; Immanuel Krauter, Erbstetten, all of Fed. Rep. of Germany

[73] Assignee: Robert Bosch GmbH, Stuttgart, Fed. Rep. of Germany

[21] Appl. No.: 490,696

[22] PCT Filed: Sep. 16, 1988

[86] PCT No.: PCT/DE88/00573

§ 371 Date: Mar. 16, 1990

§ 102(e) Date: Mar. 16, 1990

[87] PCT Pub. No.: WO89/02527

PCT Pub. Date: Mar. 23, 1989

[30] Foreign Application Priority Data

Sep. 18, 1987 [DE] Fed. Rep. of Germany ....... 3731412

[51] Int. Cl.$^5$ ...................... F02P 7/073; H03K 17/78
[52] U.S. Cl. ..................................... 123/643; 123/652
[58] Field of Search ................ 123/146.5 A, 613, 643, 123/649, 651, 652

[56] References Cited

U.S. PATENT DOCUMENTS

| 3,880,132 | 4/1975 | Whatley, Jr. ................ | 123/643 X |
| 4,122,814 | 10/1978 | Ford ........................... | 123/613 X |
| 4,194,480 | 3/1980 | Rado ........................... | 123/643 |
| 4,201,173 | 5/1980 | Okada et al. ................ | 123/651 X |
| 4,223,656 | 9/1980 | Hamley ........................ | 123/643 X |
| 4,274,135 | 6/1981 | Rosa et al. .................. | 363/68 |
| 4,403,593 | 9/1983 | Piteo .......................... | 123/651 |

FOREIGN PATENT DOCUMENTS

| 2249838 | 4/1973 | Fed. Rep. of Germany ...... | 123/649 |
| 3343853 | 6/1985 | Fed. Rep. of Germany ...... | 123/651 |
| 0108873 | 6/1984 | Japan ............................. | 123/643 |
| 2136238 | 9/1984 | United Kingdom . | |
| 88/03608 | 5/1988 | World Int. Prop. O. . | |

Primary Examiner—Willis R. Wolfe
Attorney, Agent, or Firm—Michael J. Striker

[57] ABSTRACT

A high-voltage switch is suggested which is usable particularly as an ignition voltage distributor for applying the ignition voltage to spark plugs of an internal combustion engine. The high-voltage switch comprises a cascade circuit of optoelectric semiconductor elements which are actuated or connected through by means of incident light radiation. Very high voltages can accordingly be switched in an exact manner, wherein a galvanic separation is provided between control circuit and high-voltage circuit. The control circuit can be operated with low voltage, so that use in connection with electronic ignition systems is particularly simple.

8 Claims, 3 Drawing Sheets

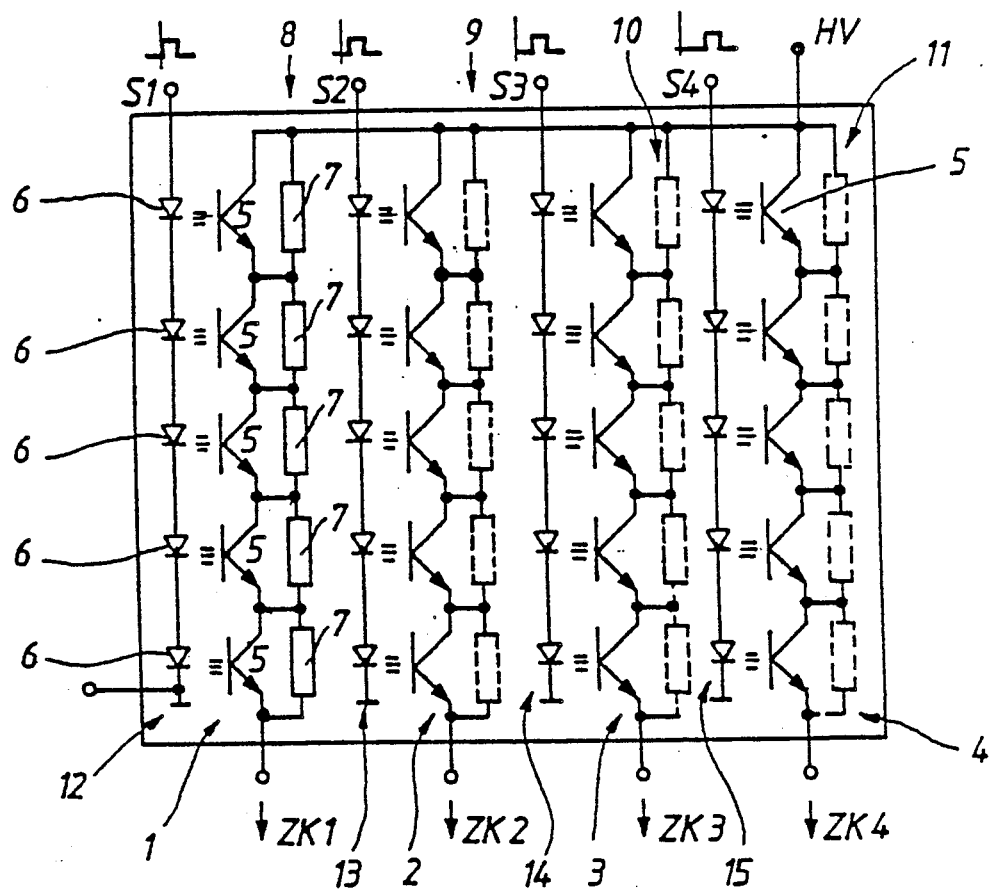
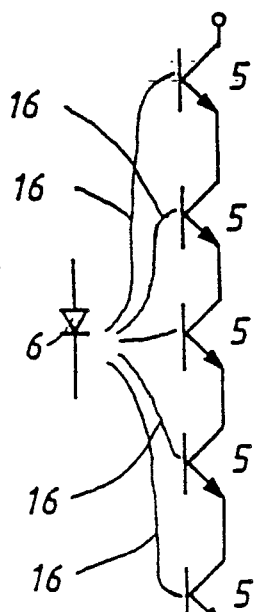
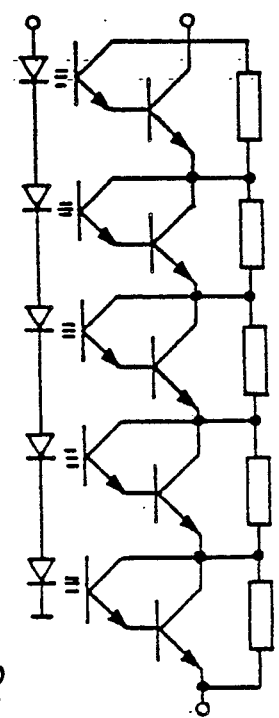
FIG. 1
FIG. 2
FIG. 3

5,002,034

HIGH-VOLTAGE SWITCH

PRIOR ART

The invention is based on a high-voltage switch according to the generic part of the main claim.

Ignition distributor arrangements are known which are constructed as so-called static high-voltage distributors and have no moving parts. These known arrangements use semiconductor elements for every spark plug to be controlled, an ignition coil being assigned to these semiconductor elements in each instance. These circuits are relatively costly and particularly expensive to produce because of the plurality of necessary ignition coils.

ADVANTAGES OF THE INVENTION

A high-voltage switch of the type named in the beginning with the characteristic features of the main claim, on the other hand, has the advantage that only one ignition coil is required for all spark plugs and that an ignition can be effected which is very accurate with respect to time. The semiconductor elements, which are in a cascade arrangement and are preferably constructed as high-voltage transistors or thyristors, are actuated by means of incident light radiation, i.e. the semiconductor elements connect through when irradiated with light and accordingly apply the ignition pulses supplied by the ignition coil to the subsequently arranged spark plug. Very good results were achieved with cascade circuits of three to fifty phototransistors or photothyristors connected in series.

A plurality of Darlington stages arranged in cascade connection can also be provided as optoelectronic high-voltage transistors.

The incident light radiation on the light-sensitive regions of the semiconductor elements proceeding from a light source can be effected directly or via light guide fibers. But, depending on the application, a light source, e.g. a light-emitting diode, can also be assigned to every semiconductor element, the light of the light-emitting diode serving in each instance to actuate one of the semiconductor elements arranged in cascade. In this latter construction, a number of light-emitting elements corresponding to the number of semiconductor elements of the cascade circuits is required.

A particularly advantageous development of the invention provides that the cascade connections of the optoelectronic semiconductor elements and the assigned light-emitting elements are constructed in each instance as a hybrid circuit in which a light permeable insulator is arranged between the optoelectric semiconductor elements and the adjacent light-emitting elements. In this way, a compact arrangement is achieved which can comprise a plurality of cascade circuits corresponding to the quantity of the spark plugs to be operated in an internal combustion engine. The cascade circuit and the respective light-emitting elements can be sealed in a common housing, so that an optimal insulation is achieved.

The light-emitting elements are preferably constructed as low-voltage elements and can be operated e.g. as light-emitting diodes with control voltages of less than 5 volts. A cascade circuit with three to fifty high-voltage transistors or thyristors can be used for connecting through 15 kV and also higher voltages, such as those occurring e.g. as ignition voltages in automotive engineering.

DRAWINGS

The invention is explained in more detail in the following by means of the drawings.

FIG. 1 shows a high-voltage switch constructed as ignition distributor arrangement;

FIG. 2 shows the basic wiring of a high-voltage switch with light guide fibers;

FIG. 3 shows a high-voltage switch with a plurality of Darlington circuits and with separate light-emitting elements;

Figure 4:
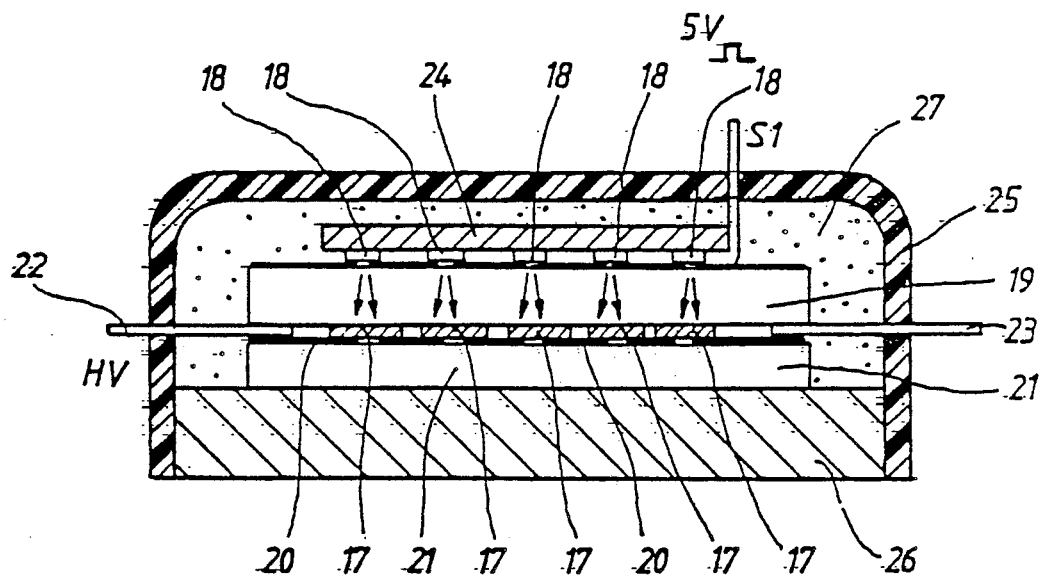
FIG. 4 shows a circuit arrangement of a high-voltage switch constructed using hybrid technology, in section.

The circuit arrangement shown in FIG. 1 is an ignition voltage distributor which contains four cascade circuits 1 to 4 which comprise five optoelectronic semiconductor elements in each instance, which semiconductor elements are constructed in this instance as high-voltage phototransistors 5. A light-emitting diode 6 is assigned to each high-voltage phototransistor 5 as light-emitting element. Voltage dividers 8 to 11 comprising a plurality of resistors 7 are provided in addition, which voltage dividers 8 to 11 serve to linearize the cascade circuits. All cascade circuits 1 to 4 are connected by one of their connection terminals with a high-voltage input HV, while their other connection terminals lead to spark plugs ZK1 to ZK4, not shown here. The series connections 12 to 15, which comprise five light-emitting diodes 6 in each instance and are assigned to the cascade circuits 1 to 4, are drivable via control inputs S1 to S4. When a control signal is applied to one of these control inputs S1 to S4, the light-emitting diodes 6 transmit a corresponding light signal to light-sensitive regions of the transistors 5, so that the respective cascade circuit connects through an the high voltage at the high-voltage input HV— e.g. 15 kV—connects through to its output, shown at bottom, and accordingly is applied to the respective spark plug.

FIG. 2 shows the basic construction of an arrangement in which the light required for driving the transistors 5 is guided from a light-emitting diode 6 via light guide fibers 16.

FIG. 3 shows an arrangement in which the cascade circuit is formed by pairs of phototransistors and transistors in a Darlington arrangement, instead of by individual phototransistors. Such an arrangement can be necessary particularly for high ignition currents or low light capacities.

FIG. 4 shows a cascade circuit constructed using hybrid technology which comprises five optoelectric semiconductor elements 17, to which a corresponding quantity of light-emitting diodes 18 are assigned at a slight distance. A glass layer 19 is located between the diodes 18 and the semiconductor elements 17 as light-permeable insulator. The semiconductor elements 17 are connected via conductor paths and resistance networks 20 and are arranged over a carrier substrate 21. The conductor paths 20 are connected with high-voltage connection lugs 22, 23 so as to be electrically conductive, wherein one of the connection lugs can be the high-voltage connection HV and the other connection lug can be the connection leading to a spark plug.

A heat conducting layer 24, which can comprise aluminum, for example, is located above the light-emitting diodes 18. The control connection S1 for the light-emitting diodes 18 is guided out of the housing 25 at the top. The housing 25 comprises plastic and is closed at the bottom by an aluminum cover 26. The interior of the housing 25 is sealed with a sealing compound 27 so that optimal insulation is achieved.

Figure 5:
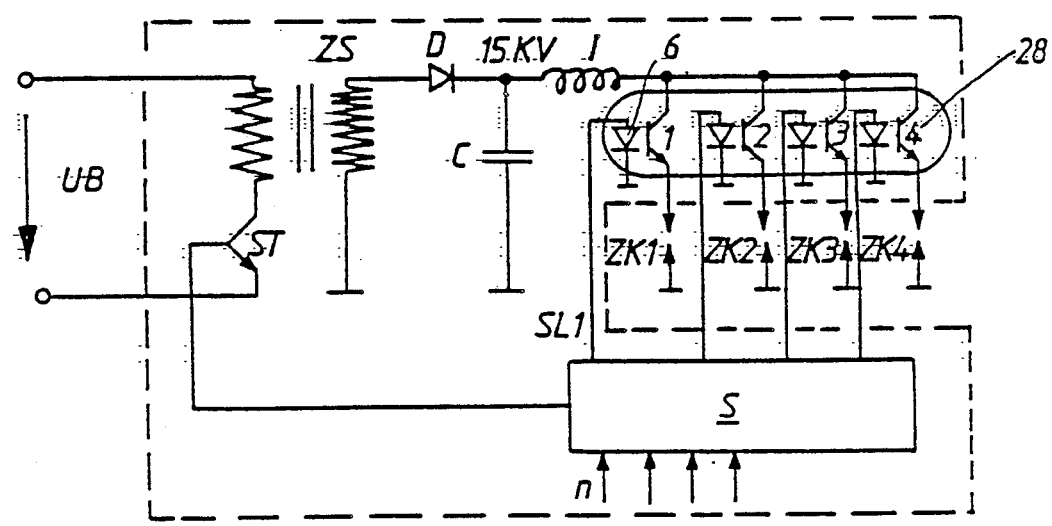
FIG. 5 shows an ignition circuit with high-voltage switch.

FIG. 5 indicates a circuit arrangement for the distribution of the ignition voltage, wherein each of the cascade circuits 1 to 4 is shown here in a simplified manner by means of a transistor element.

A battery voltage UB is applied to the primary winding of a transformer TR, wherein a switching transistor ST is connected between the latter. The switching transistor ST is continuously actuated by a control S via its base contact for generating a high voltage on the secondary side at the transformer TR. The secondary winding of the transformer TR is grounded on one side and is connected with the cascade circuit 28 on the other side via a diode D and an inductance I. One connection of a high-voltage capacitor C is connected between the diode D and the inductance I, the other connection being grounded. This high-voltage capacitor C is charged by the transformer TR via the diode D.

The control S determines the respective optimal ignition time for the different cylinders or different spark plugs ZK1 to ZK4 as a function of the engine speed n and other parameters characterizing the respective operating state of the engine. If, for example, spark plug ZK1 fires on the basis of this ignition time calculation, the control S causes a control signal to be transmitted to its control line SL1, which control signal activates the light-emitting diode 6. The light-emitting diode 6 accordingly connects through the cascade circuit 1, so that the ignition voltage arrives at the spark plug ZK1. The rest of the spark plugs ZK2 to ZK4 are acted upon by the ignition voltage at the calculated ignition times in a corresponding manner.

Figure 6:
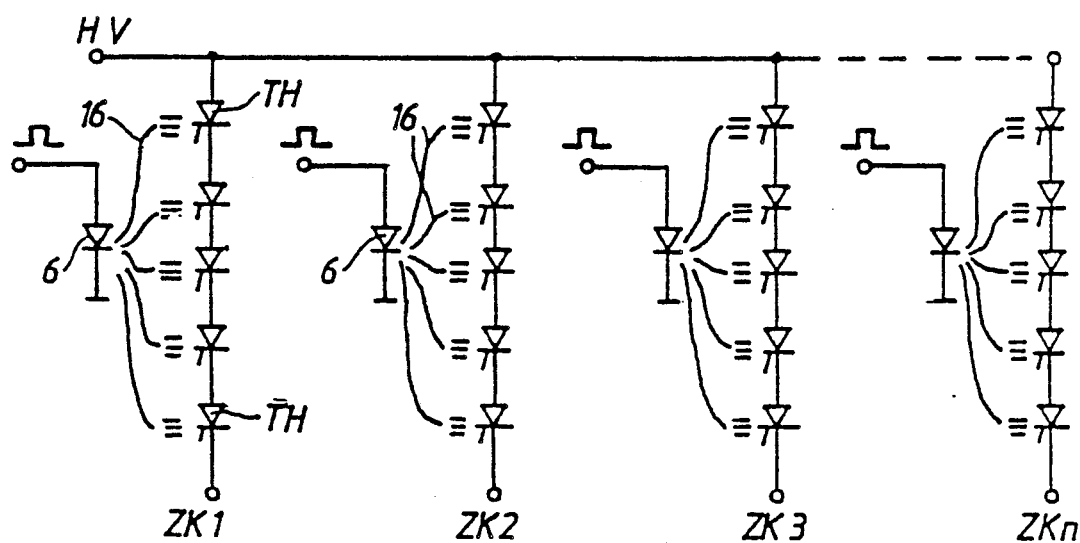
FIG. 6 shows a high-voltage switch with thyristors in cascade arrangement.

FIG. 6 shows another embodiment form of a circuit arrangement comprising a plurality of cascade circuits, wherein the optoelectric semiconductor elements are constructed in this instance as photothyristors TH and are optically coupled with one or more light-emitting diodes 6 directly or via light guide fibers 16. All shown circuit arrangements are provided for a desired number n of spark plugs ZK1 to ZKn.

The possibilities of using the high-voltage switches described in a plurality of embodiment examples, which high-voltage switches are coupled optoelectrically with a control input, are not limited to use in ignition systems of internal combustion engines. The use of an optoelectrically coupled high-voltage switch can be advantageous wherever a galvanic separation between the electric circuit and the high-voltage circuit is desired or necessary.

We claim:

1. High-voltage switch, particularly as ignition voltage distributor for applying the ignition voltage to spark plugs of an internal combustion engine, characterized in that a high voltage is applied to a connection terminal of a cascade circuit (1 to 4) comprising a plurality of optoelectronic semiconductor elements; in that at least one light-emitting element (6) is assigned to each cascade circuit (1 to 4); and in that the respective cascade circuit (1 to 4) connects through the high voltage at its other connection terminal when the light-sensitive regions of the semiconductor elements are irradiated with light.

2. High-voltage switch according to claim 1, characterized in that the semiconductor elements are constructed as high-voltage phototransistors (5) and/or photothyristors (TH).

3. High-voltage circuit according to claim 1, characterized in that the cascade circuits (1 to 4) are formed by a plurality of transistor Darlington stages.

4. High-voltage switch according to claim 1, characterized in that the light for actuating the cascade circuits (1 to 4) is guided to the light-sensitive semiconductor regions via light guide fibers (16).

5. High-voltage switch according to claim 1, characterized in that a light-emitting element (18) which can be actuated with low voltage is assigned to eery semiconductor element.

6. High-voltage switch according to claim 5, characterized in that the cascade circuits of the optoelectric semiconductor elements (17) and the assigned light-emitting elements (18) are constructed as a hybrid circuit in which a light-permeable insulator (19) is arranged between the optoelectric semiconductor elements (17) and the adjacent light-emitting elements (18).

7. High-voltage switch according to claim 1, characterized in that the light-emitting elements (6, 18) work with low voltage.

8. High-voltage switch according to claim 1, characterized in that a cascade circuit (1 to 4) with respective light-emitting elements (6, 18) is assigned to every spark plug (ZK1 to ZK4) of an internal combustion engine.

* * * * *